(12) United States Patent
Arai et al.

(10) Patent No.: US 12,495,630 B2
(45) Date of Patent: Dec. 9, 2025

(54) IMAGING APPARATUS

(71) Applicant: SONY SEMICONDUCTOR SOLUTIONS CORPORATION, Kanagawa (JP)

(72) Inventors: Chihiro Arai, Kanagawa (JP); Tomoyoshi Fujinohara, Kumamoto (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 279 days.

(21) Appl. No.: 18/252,918

(22) PCT Filed: Nov. 12, 2021

(86) PCT No.: PCT/JP2021/041677
§ 371 (c)(1),
(2) Date: May 15, 2023

(87) PCT Pub. No.: WO2022/113774
PCT Pub. Date: Jun. 2, 2022

(65) Prior Publication Data
US 2024/0014239 A1    Jan. 11, 2024

(30) Foreign Application Priority Data
Nov. 24, 2020   (JP) ................. 2020-194415

(51) Int. Cl.
*H10F 39/00*   (2025.01)
(52) U.S. Cl.
CPC ....... *H10F 39/8063* (2025.01); *H10F 39/804* (2025.01); *H10F 39/8057* (2025.01)
(58) Field of Classification Search
CPC ............ H10F 39/8063; H10F 39/8057; H10F 39/804; H10F 39/12–199; H10F 39/805; H10F 39/80; H01L 27/146
See application file for complete search history.

(56) References Cited

U.S. PATENT DOCUMENTS

| | | |
|---|---|---|
| 2002/0044213 A1 | 4/2002 | Shinomiya et al. |
| 2011/0049557 A1 | 3/2011 | Meng |

(Continued)

FOREIGN PATENT DOCUMENTS

| | | |
|---|---|---|
| JP | H09-232551 | 9/1997 |
| JP | 2002-124654 | 4/2002 |

(Continued)

OTHER PUBLICATIONS

International Search Report and Written Opinion prepared by the Japan Patent Office on Jan. 24, 2022, for International Application No. PCT/JP2021/041677, 3 pgs.

*Primary Examiner* — Lauren R Bell
(74) *Attorney, Agent, or Firm* — Sheridan Ross PC

(57) ABSTRACT

To provide an imaging apparatus that is advantageous for reducing the influence of stray light on a captured image. The imaging apparatus includes: a semiconductor substrate including a plurality of effective pixels that performs photoelectric conversion; an effective covering part including an optical element and covering the plurality of effective pixels in the semiconductor substrate; and a peripheral covering part covering a portion positioned outside the plurality of effective pixels in the semiconductor substrate, in which the plurality of effective pixels and the effective covering part are included in an effective pixel region structure, the portion positioned outside the plurality of effective pixels in the semiconductor substrate and the peripheral covering part are included in a peripheral region structure, and the peripheral region structure includes a recessed interface forming body having a recessed interface.

17 Claims, 13 Drawing Sheets

(56) References Cited

U.S. PATENT DOCUMENTS

| | | |
|---|---|---|
| 2019/0221597 A1* | 7/2019 | Noh .................. H10F 39/12 |
| 2021/0134856 A1* | 5/2021 | Ootsuka .................. G02B 5/20 |
| 2021/0202561 A1 | 7/2021 | Baba et al. |
| 2022/0109016 A1* | 4/2022 | Kim .................. H10F 39/8063 |

FOREIGN PATENT DOCUMENTS

| | | |
|---|---|---|
| JP | 2011-054794 | 3/2011 |
| JP | 2013-207201 | 10/2013 |
| WO | WO 2018/139278 | 8/2018 |
| WO | WO 2020/054272 | 3/2020 |
| WO | WO 2020/166309 | 8/2020 |

* cited by examiner

IMAGING APPARATUS

CROSS REFERENCE TO RELATED APPLICATIONS

This application is a national stage application under 35 U.S.C. 371 and claims the benefit of PCT Application No. PCT/JP2021/041677, having an international filing date of 12 Nov. 2021, which designated the United States, which PCT application claimed the benefit of Japanese Patent Application No. 2020-194415, filed 24 Nov. 2020, the entire disclosures of each of which are incorporated herein by reference.

TECHNICAL FIELD

The present disclosure relates to an imaging apparatus.

BACKGROUND ART

Imaging apparatuses in which optical elements such as microlenses are provided so as to cover imaging regions (that is, a plurality of effective pixels) of a semiconductor substrate are widely used in various devices such as mobile devices (for example, see Patent Document 1 and Patent Document 2).

CITATION LIST

Patent Document

Patent Document 1: Japanese Patent Application Laid-Open No. 2002-124654
Patent Document 2: Japanese Patent Application Laid-Open No. H09-232551

SUMMARY OF THE INVENTION

Problems to be Solved by the Invention

There is a case where a part of light incident on the imaging apparatus is unexpectedly reflected on the surfaces of various members constituting the imaging apparatus to become so-called stray light. In particular, light traveling toward the outside of the imaging region is not originally incident on the imaging region, but there is a case where the light is unintentionally reflected outside the imaging region, and as a result, is incident on the imaging region.

The stray light generated in this way causes a phenomenon called flare or ghost in the captured image, and possibly impair the quality of a captured image.

The present disclosure provides an imaging apparatus that is advantageous for reducing the influence of stray light on a captured image.

Solutions to Problems

One aspect of the present disclosure relates to an imaging apparatus including: a semiconductor substrate including a plurality of effective pixels that performs photoelectric conversion; an effective covering part including an optical element and covering the plurality of effective pixels in the semiconductor substrate; and a peripheral covering part covering a portion positioned outside the plurality of effective pixels in the semiconductor substrate, in which the plurality of effective pixels and the effective covering part are included in an effective pixel region structure, the portion positioned outside the plurality of effective pixels in the semiconductor substrate and the peripheral covering part are included in a peripheral region structure, and the peripheral region structure includes a recessed interface including a member different from the optical element.

Another aspect of the present disclosure relates to an imaging apparatus including: a semiconductor substrate including a plurality of effective pixels that performs photoelectric conversion; an effective covering part including an optical element provided with a lens member and covering the plurality of effective pixels in the semiconductor substrate; and a peripheral covering part covering a portion positioned outside the plurality of effective pixels in the semiconductor substrate, in which the optical element is divided into an effective optical element portion included in the effective covering part and a peripheral optical element portion included in the peripheral covering part, and the lens member included in the peripheral optical element portion has a recessed interface.

The recessed interface may be provided at a position away from the optical element in a layer extending direction perpendicular to a direction in which the semiconductor substrate and the optical element are laminated.

The recessed interface may be provided adjacent to the optical element regarding a relative position in the layer extending direction perpendicular to a direction in which the semiconductor substrate and the optical element are laminated.

An entire part of the recessed interface may be formed by a recess provided in the peripheral covering part.

The peripheral covering part may include an insulating layer positioned on the semiconductor substrate, and a light shielding part including a first light shielding part positioned on the semiconductor substrate with the insulating layer interposed between the first light shielding part and the semiconductor substrate, and a second light shielding part positioned on the semiconductor substrate, in which a portion forming the recessed interface among the peripheral region structure may include the second light shielding part.

At least a part of the recessed interface may be formed by a recess provided in the semiconductor substrate.

The imaging apparatus may include: a protruding body positioned outside the plurality of effective pixels and protruding more than the optical element; and a bonding material that bonds the protruding body to the semiconductor substrate, in which the recessed interface may be positioned at least between the optical element and the protruding body with respect to the layer extending direction perpendicular to the direction in which the semiconductor substrate and the optical element are laminated.

With respect to the layer extending direction, the recessed interface extends at least from a position between the optical element and the protruding body to a position between the protruding body and the semiconductor substrate.

The recessed interface extends at least from a position between the optical element and the protruding body to a position between the protruding body and the semiconductor substrate in the layer extending direction.

The recessed interface may be connected to a bonding surface including a surface of a member included in the peripheral region structure, the bonding surface being in contact with the bonding material.

An entire or a part of a recessed region defined by the recessed interface may be a space.

The recessed interface may at least partially have an uneven portion.

The imaging apparatus may include the protruding body positioned outside the plurality of effective pixels and protruding more than the optical element, in which the protruding body may have a surface that at least partially has an uneven portion on a side of the optical element.

The imaging apparatus includes the protruding body positioned outside the plurality of effective pixels and protruding more than the optical element, in which the protruding body has a surface that at least partially has an uneven portion on a side of the optical element, and the uneven portion included in the recessed interface and the uneven portion included in the protruding body are different from each other in at least one of a size and a pitch.

The recessed interface may be provided in a forward tapered shape.

The recessed interface may be provided in a reverse tapered shape.

The imaging apparatus may include a cover body positioned on a side of the optical element opposite to the semiconductor substrate, the cover body covering at least the plurality of effective pixels, in which the optical element and the cover body may have a space formed therebetween.

The imaging apparatus may include a cover body positioned on the side of the optical element opposite to the semiconductor substrate, the cover body covering at least the plurality of effective pixels, and a filler that fills a region between each of the effective covering part and the peripheral covering part and the cover body.

MODE FOR CARRYING OUT THE INVENTION

Figure 1:
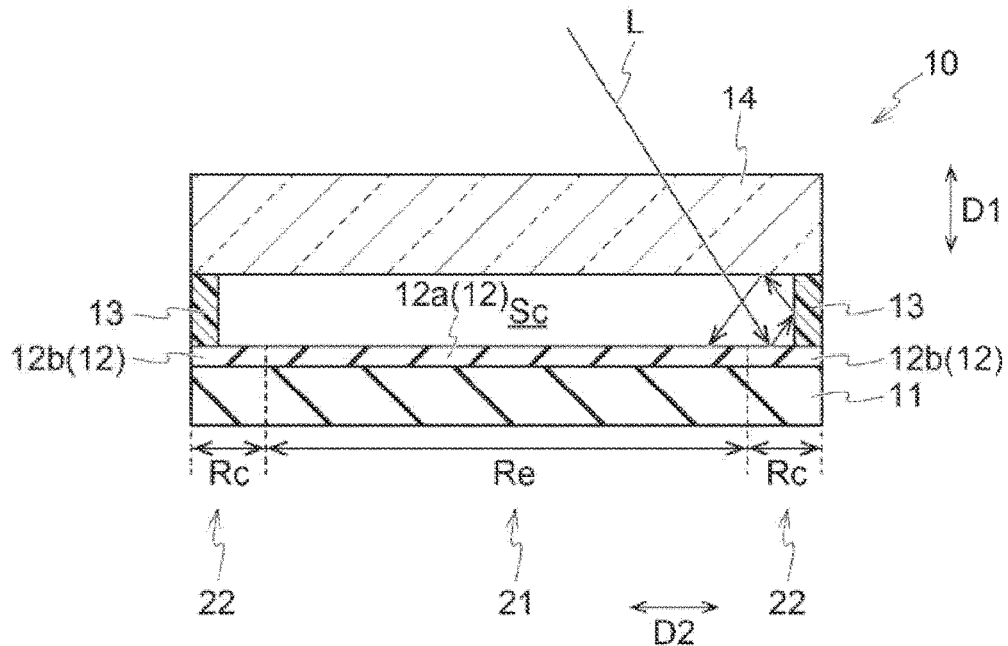
FIG. 1 is a cross-sectional view showing a schematic configuration example of an imaging apparatus.
Figure 2:
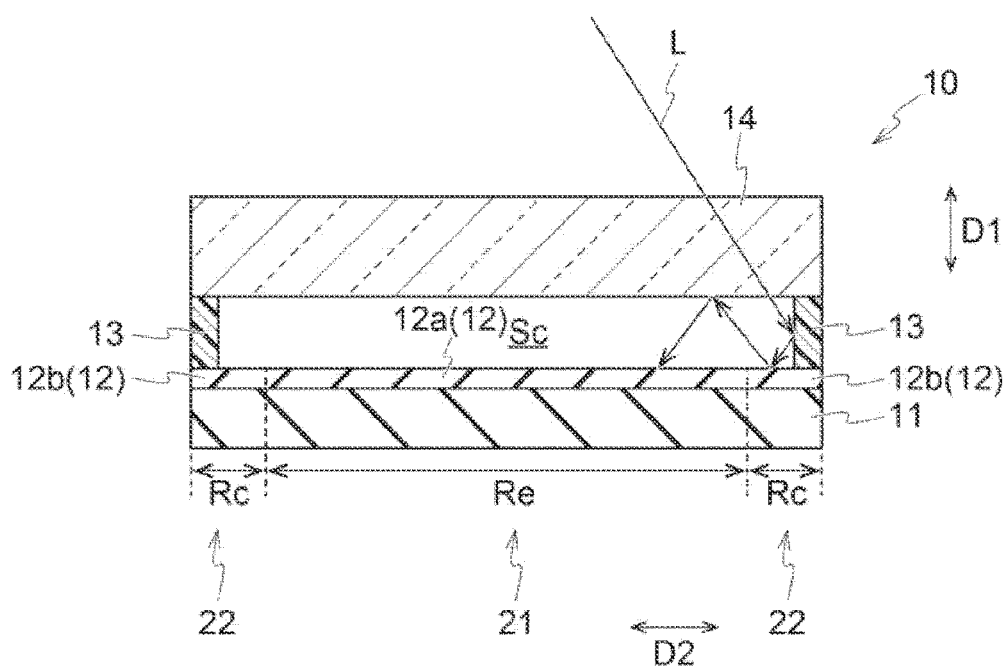
FIG. 2 is a cross-sectional view showing a schematic configuration example of the imaging apparatus.

FIGS. 1 and 2 are cross-sectional views each showing a schematic configuration example of an imaging apparatus 10.

The imaging apparatus 10 shown in FIGS. 1 and 2 is an imaging apparatus mounted with a wafer level chip size package (WL-CSP), in which a first semiconductor substrate 11, a covering part 12, a protruding body (DAM material) 13, and a cover body 14 are sequentially laminated in a laminating direction D1.

The first semiconductor substrate 11 includes a plurality of effective pixels (not illustrated in FIGS. 1 and 2; refer to a reference numeral "20" in FIG. 3 described below). The plurality of effective pixels is two-dimensionally aligned in a layer extending direction D2 orthogonal to the laminating direction D1 on the light-entering side surface (upper surface in FIG. 1) of the first semiconductor substrate 11, and constitutes a light-receiving surface (that is, an imaging surface).

The covering part 12 includes an optical element such as an on-chip macro lens (not illustrated in FIGS. 1 and 2; refer to a reference numeral "27" in FIG. 3 described later), and covers the light-entering side surface of the first semiconductor substrate 11. The covering part 12 includes an effective covering part 12a and a peripheral covering part 12b surrounding the effective covering part 12a. The effective covering part 12a covers the light-receiving surface (that is, the plurality of effective pixels) among the light-entering side surface of the first semiconductor substrate 11. The peripheral covering part 12b covers a portion (that is, a peripheral surface) positioned outside the plurality of effective pixels among the light-entering side surface of the first semiconductor substrate 11.

Therefore, an effective pixel region structure 21 that is present in an effective pixel region Re includes the plurality of effective pixels and the effective covering part 12a. Meanwhile, a peripheral region structure 22 that is present in a peripheral region Rc surrounding the effective pixel region Re includes a portion among the first semiconductor substrate 11 positioned outside the plurality of effective pixels and the peripheral covering part 12b.

The protruding body 13 is positioned outside the plurality of effective pixels respect to the layer extending direction D2, and protrudes from the covering part 12 in the laminating direction D1. The protruding body 13 has a planar shape surrounding the entire periphery of the effective pixel region Re and is fixed to the peripheral covering part 12b (particularly, the outer peripheral part) in the peripheral region Rc.

The cover body 14 is positioned on the side of the covering part 12 (including the optical element) opposite to the first semiconductor substrate 11, and is fixed to the protruding body 13 with an adhesive or the like interposed therebetween. The cover body 14 includes a translucent member (for example, glass) that covers at least the plurality of effective pixels (in the example shown in FIG. 1, the entire light-entering side surface of the first semiconductor substrate 11).

A cavity space Sc between the covering part 12 (including the optical element) and the cover body 14 is formed as a space. A space may not be formed between the covering part 12 and the cover body 14. For example, a light-transmissive member such as resin may be provided so as to fill the cavity space Sc (see a reference numeral "40" in FIGS. 18 and 19 described later).

Light L from a subject enters the plurality of effective pixels through the cover body 14, the cavity space Sc, and the effective covering part 12a to allow a subject image to be acquired as a captured image by the imaging apparatus 10.

Meanwhile, the light L incident on the imaging apparatus 10 is possibly unintentionally reflected inside the imaging apparatus 10 and becomes stray light. There is a case where the stray light generated in this manner is incident on the effective pixel region Re (that is, the effective pixels) after being reflected by various members constituting the imaging apparatus 10, resulting in flare or the like in the captured image. In particular, as shown in FIGS. 1 and 2, the light L traveling toward the outside of the effective pixel region Re (that is, the peripheral region Rc) is not originally incident on the effective pixel, but there is a case where the light L is repeatedly reflected by the peripheral member and finally incident on the effective pixel.

Figure 3:
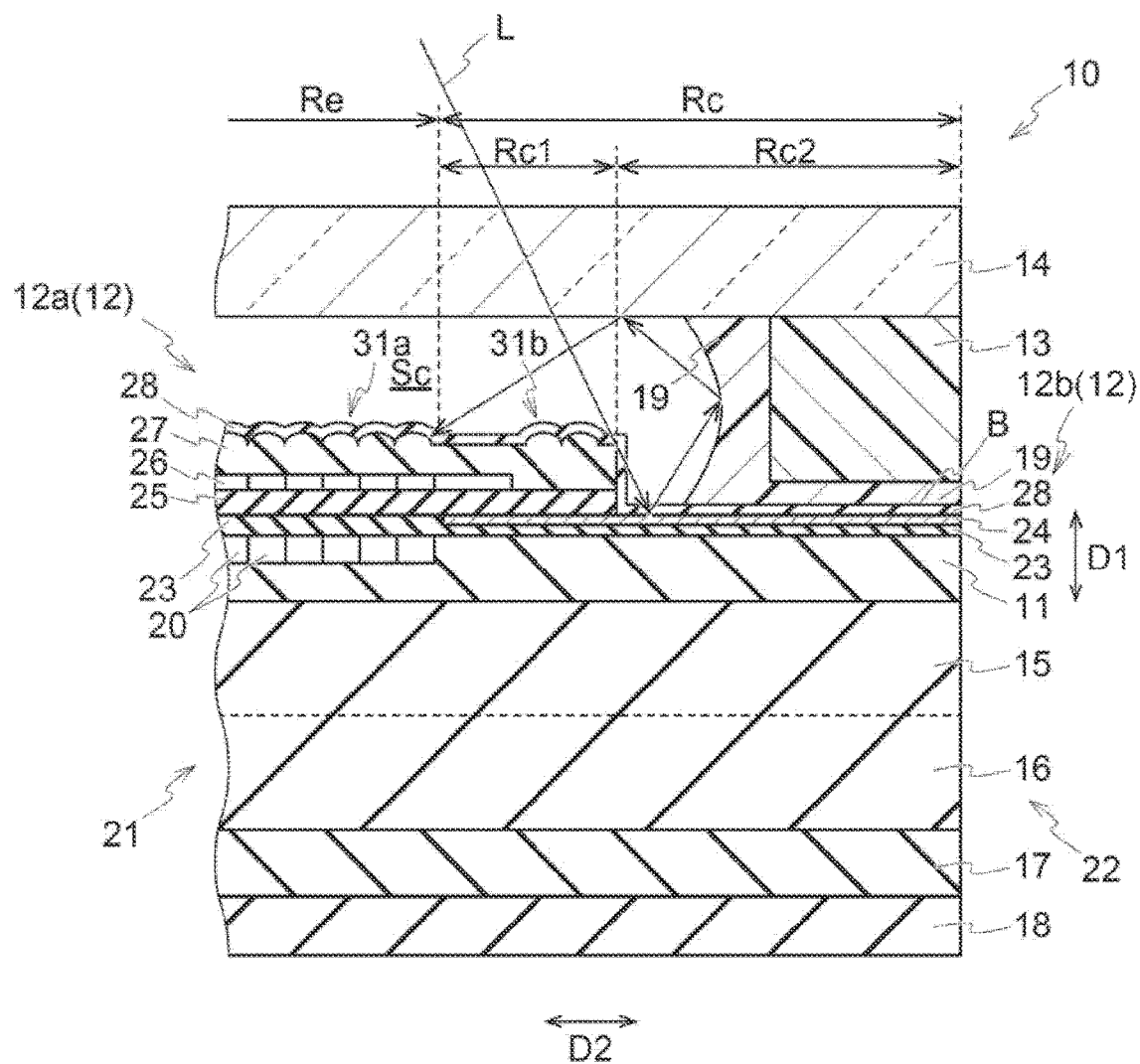
FIG. 3 is an enlarged cross-sectional view showing a schematic configuration example of the imaging apparatus.

FIG. 3 is an enlarged cross-sectional view showing a schematic configuration example of the imaging apparatus 10.

Although the specific configuration shown in FIG. 3 is described later in detail, the imaging apparatus 10 includes a light shielding part 24.

The light shielding part 24 is positioned outside the plurality of effective pixels 20 with respect to the layer extending direction D2, and is included in the peripheral covering part 12b covering the first semiconductor substrate 11 in the peripheral region Rc. The light shielding part 24 is provided to shield the light L incident on the outside of the plurality of effective pixels and can include any material having excellent light shielding properties. Typically, the light shielding part 24 can be configured using a member (for example, tungsten) having excellent light shielding properties to visible light and near-infrared light.

The light shielding part 24 can reduce incidence of stray light on the effective pixel 20.

However, a part of the light L traveling toward the peripheral region Rc may be reflected by the light shielding part 24. As shown in FIG. 3, there is a case where the light L reflected by the light shielding part 24 becomes stray light, is repeatedly reflected, and is finally incident on the effective pixel 20 to cause flare or the like.

As described above, the stray light generated from the light L incident on the imaging apparatus 10 (particularly, the peripheral region Rc) can cause an unintended phenomenon such as flare in the captured image.

Hereinafter, a structure example of the imaging apparatus 10 advantageous for reducing the influence of stray light on the captured image is described, the stray light being generated from the light L incident on the end part of the imaging apparatus 10. Each constitutional element included in each of the imaging apparatuses 10 described below can be appropriately manufactured using a known material and a known technology (for example, photolithography, etching, or the like).

Figure 4:
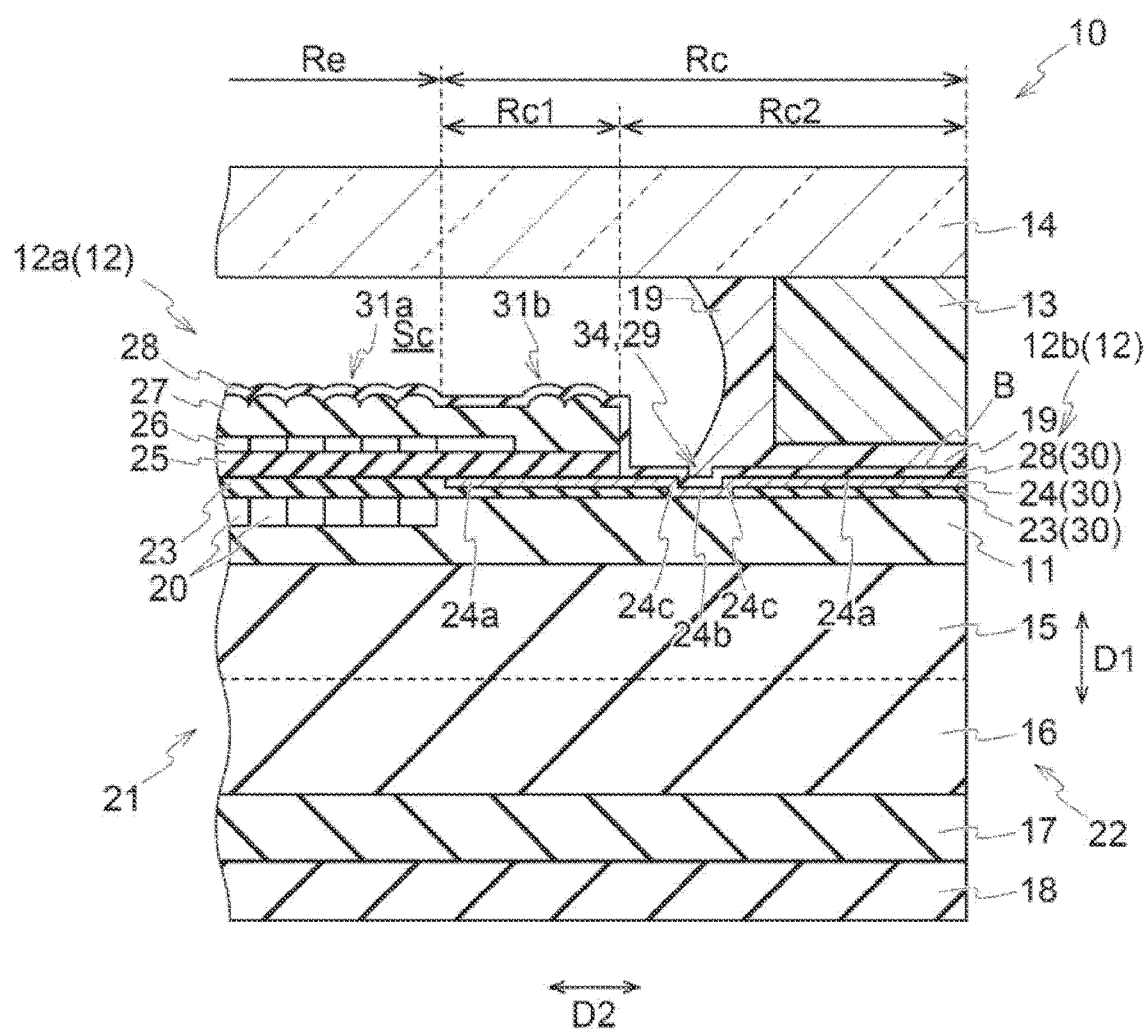
FIG. 4 is an enlarged cross-sectional view showing a first structure example of the imaging apparatus.

FIG. 4 is an enlarged cross-sectional view showing a first structure example of the imaging apparatus 10.

In the imaging apparatus 10 shown in FIG. 4, similarly to the imaging apparatus 10 shown in FIGS. 1 to 3 described above, the covering part 12, the protruding body 13, and the cover body 14 are sequentially laminated in the laminating direction D1 on the light-entering side surface (the upper surface in FIG. 4) of the first semiconductor substrate 11.

On the other hand, a first wiring layer 15, a second wiring layer 16, a second semiconductor substrate 17, and a covering insulating layer 18 are sequentially laminated on a wiring side surface (lower surface in FIG. 4) positioned on the opposite side to the light-entering side surface in the first semiconductor substrate 11.

Although not illustrated, each of the first wiring layer 15 and the second wiring layer 16 includes wiring provided in a multilayer manner and an insulator provided between the layers of wiring. The first semiconductor substrate 11 (including the plurality of effective pixels 20) and the second semiconductor substrate 17 are electrically connected to each other via layers of wiring of the first wiring layer 15 and the second wiring layer 16.

A logic circuit is formed on the second semiconductor substrate 17. The logic circuit can include any processing circuit, and includes, for example, a signal processing circuit that processes a signal output from the first semiconductor substrate 11 (for example, each effective pixel 20). A control circuit that controls each effective pixel 20 may be provided on either the first semiconductor substrate 11 or the second semiconductor substrate 17.

The covering insulating layer 18 includes any insulating material. The covering insulating layer 18 is attached with a back electrode (not illustrated; for example, a solder ball) provided to electrically connect with an external substrate (not illustrated). The back electrode is electrically connected to the wiring of the second wiring layer 16 via an electrode penetrating the second semiconductor substrate 17 and the covering insulating layer 18.

In the effective pixel region Re, a first light-entering side insulating layer 23, a second light-entering side insulating layer 25, a color filter 26, a lens member 27, and a protective film 28 are sequentially laminated on the light-entering side surface of the first semiconductor substrate 11 (that is, on the plurality of effective pixels 20).

The first light-entering side insulating layer 23 can include any material (for example, an oxide film) exhibiting translucency and insulation, is positioned on the light-entering side surface of the first semiconductor substrate 11, and is in contact with the light-entering side surface. The second light-entering side insulating layer 25 can include any material exhibiting translucency and insulation, and serves as a planarization film. The color filter 26 is a translucent RGB filter. The lens member 27 constitutes an on-chip microlens (OCL) in a range corresponding to at least the plurality of effective pixels 20. The protective film 28 can include any protective member exhibiting translucency.

As described above, the effective covering part 12a covering the plurality of effective pixels 20 in the covering part 12 includes these optical elements (that is, the first light-entering side insulating layer 23, the second light-entering side insulating layer 25, the color filter 26, the lens member 27, and the protective film 28).

However, the first light-entering side insulating layer 23 extends in the layer extending direction D2 so as to cover the entire light-entering side surface of the first semiconductor substrate 11, and is present not only in the effective pixel region Re but also in the peripheral region Rc. The second light-entering side insulating layer 25, the color filter 26, and the lens member 27 extend in the layer extending direction D2 over the entire effective pixel region Re and a part of the peripheral region Rc. The protective film 28 is present not only in the effective pixel region Re but also in the peripheral region Rc, and covers the entire light-entering side surface of the first semiconductor substrate 11.

As described above, the optical element covering the plurality of effective pixels 20 is divided into an effective optical element portion 31a included in the effective covering part 12a and a peripheral optical element portion 31b included in the peripheral covering part 12b.

Among the peripheral region Rc, a region where the lens member 27 extending from the effective pixel region Re is present is referred to as a first peripheral region Rc1, and a region outside the first peripheral region Rc1 with respect to the layer extending direction D2 is referred to as a second peripheral region Rc2.

The peripheral covering part 12b that is present among the first peripheral region Rc1 among the covering part 12 includes the first light-entering side insulating layer 23, the light shielding part 24, the second light-entering side insulating layer 25, the color filter 26, the lens member 27, and the protective film 28. Meanwhile, the peripheral covering part 12b that is present in the second peripheral region Rc2 includes the first light-entering side insulating layer 23, the light shielding part 24, and the protective film 28.

The light shielding part 24 includes a first light shielding part 24a, a second light shielding part 24b, and a third light shielding part 24c. The first light shielding part 24a is positioned on the first semiconductor substrate 11 with the first light-entering side insulating layer 23 interposed therebetween. The second light shielding part 24b is positioned on the first semiconductor substrate 11 without the first light-entering side insulating layer 23 interposed therebetween, and is connected to the first light shielding part 24a through the third light shielding part 24c. As described above, the second light shielding part 24b is in direct contact with the first semiconductor substrate 11 to allow the light shielding part 24 to be electrically conducted with the first semiconductor substrate 11.

The protruding body 13 provided on the peripheral covering part 12b is positioned outside the optical element (in particular, the lens member 27) covering the plurality of effective pixels 20 with respect to the layer extending direction D2, and protrudes in the laminating direction D1 from the optical element to support the cover body 14.

A bonding material 19 fixedly bonds the protruding body 13 to the first semiconductor substrate 11. The bonding material 19 can include any adhesive, and is positioned at least between the first semiconductor substrate 11 and the protruding body 13. The bonding material 19 shown in FIG. 4 is provided not only in the entire region between the protruding body 13 and the protective film 28 but also in a range closer to the effective pixel region Re side than the protruding body 13, and bonds the protruding body 13 to the protective film 28.

As described above, with respect to the layer extending direction D2, the peripheral region Rc is divided into the first peripheral region Rc1 in which the first semiconductor substrate 11 is covered with the lens member 27 and the second peripheral region Rc2 in which the first semiconductor substrate 11 is not covered with the lens member 27. Therefore, the peripheral region structure 22 is divided into a portion positioned in the first peripheral region Rc1 and a portion positioned in the second peripheral region Rc2.

The peripheral region structure 22 of the present example includes a recessed interface forming body 30 having a recessed interface 29. More specifically, the peripheral region structure 22 has a recessed interface 29 including a member different from the above-described optical element (that is, the first light-entering side insulating layer 23, the second light-entering side insulating layer 25, the color filter 26, the lens member 27, and the protective film 28).

The recessed interface 29 means a locally depressed recessed interface and defines a recessed region. The recessed region referred to herein can include the entire region depressed with respect to the light-entering side (that is, the upper side in FIG. 4), and the specific shape of the recessed region is not limited. Therefore, the shape of the recessed interface 29 is also not limited, and surfaces (for example, the bottom surface and the side surface) that define the recessed region correspond to the recessed interface 29. The recessed region may be a space, or some kind of member may be present in whole or in part. Therefore, the recessed interface 29 may be exposed to the space or may be covered by being in contact with some kind of member.

In the imaging apparatus 10 shown in FIG. 4, a through hole is formed in the first light-entering side insulating layer 23 in the peripheral region Rc (particularly, the second peripheral region Rc2), and the through hole is used as a contact groove 34. The contact groove 34 is provided to establish electrical conduction between the first semiconductor substrate 11 and the light shielding part 24. Specifically, the second light shielding part 24b and the third light shielding part 24c are positioned in the contact groove 34, and the second light shielding part 24b comes into contact with the light-entering side surface of the first semiconductor substrate 11 and is electrically conducted with the first semiconductor substrate 11.

As described above, a portion forming the recessed interface 29 among the peripheral region structure 22 includes the second light shielding part 24b and the third light shielding part 24c. In addition, another recessed interface 29 is also formed by a portion of the protective film 28 positioned on the second light shielding part 24b and the third light shielding part 24c (that is, a portion corresponding to the contact groove 34).

Note that the first light-entering side insulating layer 23 (particularly, a portion forming the side surface of the contact groove 34) also forms the recessed interface 29. However, because the light L is blocked by the light shielding part 24, the recessed interface 29 including the first light-entering side insulating layer 23 hardly or not at all contributes to the reflection (scattering) of the light L.

As described above, in the example shown in FIG. 4, each of the protective film 28, the light shielding part 24, and the first light-entering side insulating layer 23 serves as the recessed interface forming body 30 that forms the recessed interface 29.

The recessed interface 29 configured as described above may be positioned at least between the lens member 27 and the protruding body 13 with respect to the layer extending direction D2. The recessed interface 29 shown in FIG. 4 is provided to surround the entire effective pixel region Re at a position away from the lens member 27 in the layer extending direction D2. Note that the recessed interface 29 may continuously extend or intermittently extend in the circumferential direction.

As described above, the entire recessed interface 29 shown in FIG. 4 includes the recess provided in the peripheral covering part 12b, and is provided in a portion of the peripheral region structure 22 other than the peripheral optical element portion 31b.

According to the imaging apparatus 10 shown in FIG. 4 described above, at least a part of the light L incident on the peripheral region Rc is effectively scattered by the recessed interface 29, and as a result, flare and the like can be reduced. Note that, from the viewpoint of reducing the influence of stray light on the captured image, it is advantageous that the recessed interface 29 has surface properties that effectively promote scattering of the light L, and may be, for example, a rough surface.

In addition, the recessed interface 29 is connected to a bonding surface B including a surface of a member included in the peripheral region structure 22 and is in contact with the bonding material 19. In the example shown in FIG. 4, the surface of the protective film 28 on the protruding body 13 side forms the bonding surface B and the recessed interface 29. Because the bonding surface B and the recessed interface 29 includes the same surface of the same member in this manner, the recessed region defined by the recessed interface 29 effectively serves to block the bonding material 19.

In general, in a case where the protruding body 13 is bonded to the first semiconductor substrate 11 using the bonding material 19, protrusion of the bonding material 19 called bleeding possibly occurs. There is a concern that the protruded bonding material 19 flows out to the effective pixel region Re side and adheres to the optical element and the like (that is, the effective pixel region structure 21) that is present in the effective pixel region Re, which causes the optical characteristics of the imaging apparatus 10 to be affected. In order to avoid the bonding material 19 to be adhered to the effective pixel region structure 21 in this manner, it is conceivable to increase the distance between the protruding body 13 and the lens member 27 in the layer extending direction D2. However, in this case, the entire imaging apparatus 10 increases in size in the layer extending direction D2.

On the other hand, according to the imaging apparatus 10 shown in FIG. 4, the bonding material 19 flowing out from between the protruding body 13 and the first semiconductor substrate 11 flows along the protective film 28, and at least a part thereof can be captured in the recessed region defined by the recessed interface 29 formed by the protective film 28. Therefore, unintended adhering of the bonding material 19 to the effective pixel region structure 21 can be effectively prevented. Furthermore, the distance in the layer extending direction D2 between the protruding body 13 and the lens member 27 can be shortened, and the entire imaging apparatus 10 can be downsized.

Note that in the example shown in FIG. 4, the entire recessed region defined by the recessed interface 29 is filled with the bonding material 19, but the entire or a part of the recessed region may not be filled with the bonding material 19. In a case where scattering of the light L incident on the recessed region is promoted by the whole or a part of the recessed region not being filled with the bonding material 19, the flare and the like can be expected to be further reduced.

Note that, in the solid-state imaging apparatus of Patent Document 1, the influence of the bleeding of the underfill is reduced by imposing restrictions on the distance between the imaging element and the peripheral member (FPC) and the distance between the microlens and the peripheral member. The distance restrictions as described above between the elements result in design constraints at the time of designing a chip and constraints in device mounting conditions (for example, adhesive viscosity and adhesion conditions).

On the other hand, according to the imaging apparatus 10 shown in FIG. 4 described above, because the distance between the respective elements is not at all or hardly restricted, the chip can be designed with a high degree of freedom and the apparatus can be mounted under loose conditions.

In the photoelectric conversion apparatus of Patent Document 2, diffusion of the anisotropic conductive paste is prevented by dividing the microlens. However, the structure for dividing the microlens may be disadvantageous for downsizing the entire chip.

On the other hand, according to the imaging apparatus 10 shown in FIG. 4 described above, the lens member 27 constituting the on-chip microlens does not need to be divided, which is advantageous for downsizing the entire chip.

Figure 5:
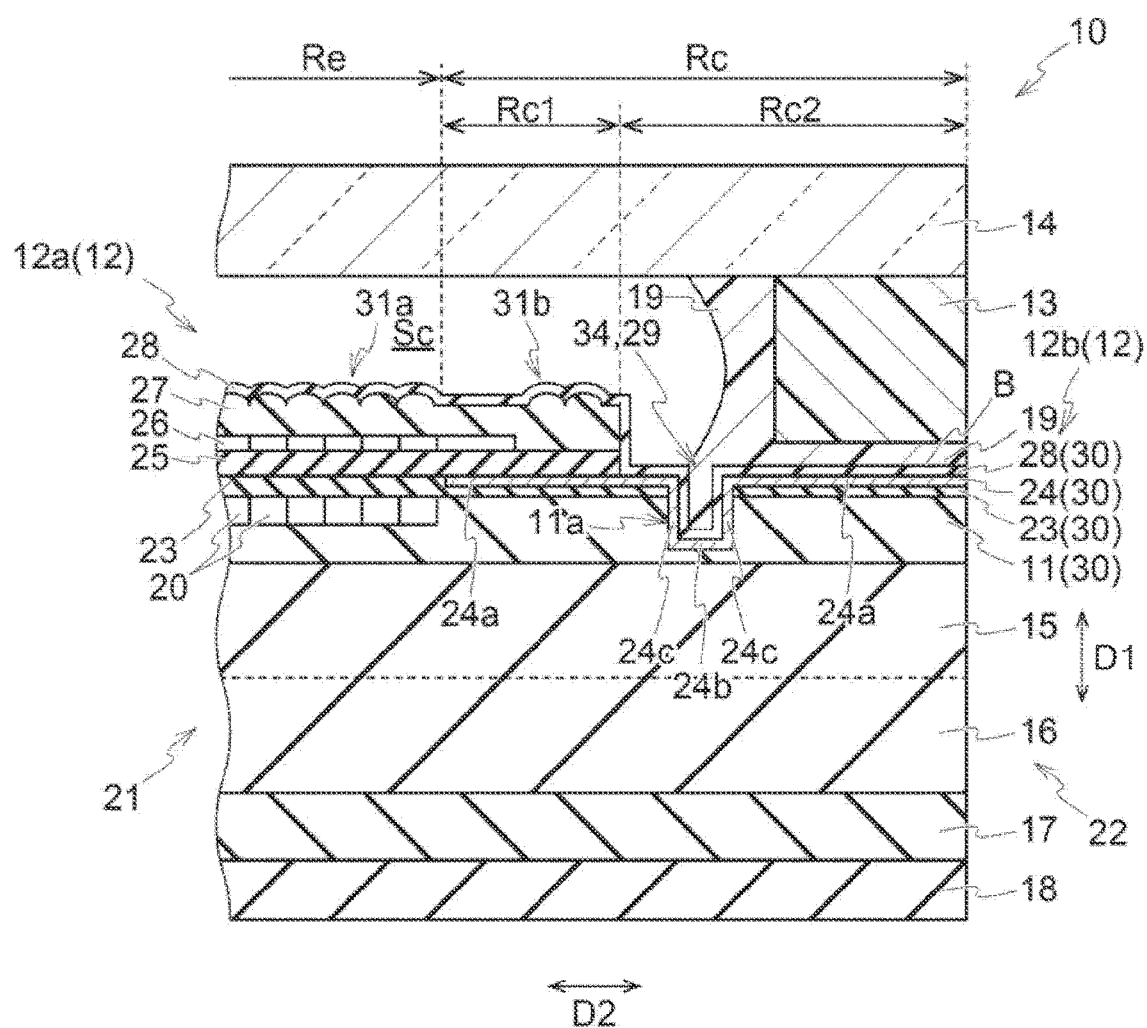
FIG. 5 is an enlarged cross-sectional view showing a second structure example of the imaging apparatus.

FIG. 5 is an enlarged cross-sectional view showing a second structure example of the imaging apparatus 10.

The recessed interface 29 may include at least in a part thereof, a recess 11a provided in the first semiconductor substrate 11.

In the imaging apparatus 10 shown in FIG. 5, the first semiconductor substrate 11 has the recess 11a. The recess 11a of the first semiconductor substrate 11 is adjacent to the through hole of the first light-entering side insulating layer 23 in the laminating direction D1, and constitutes the contact groove 34 together with the through hole of the first light-entering side insulating layer 23.

The peripheral covering part 12b (specifically, the light shielding part 24 and the protective film 28) is provided in a recessed shape along a surface defining the contact groove 34.

Also in this example, each of the light shielding part 24 and the protective film 28 functions as the recessed interface forming body 30, and a portion of the light shielding part 24 and the protective film 28 positioned in the contact groove 34 forms the recessed interface 29. Note that the first light-entering side insulating layer 23 and the first semiconductor substrate 11 also serve as the recessed interface forming body 30 forming the recessed interface 29. However, the recessed interface 29 formed by the first light-entering side insulating layer 23 and the first semiconductor substrate 11 hardly or not at all contributes to the reflection (scattering) of the light L because the recessed interface 29 is covered by the light shielding part 24.

Other configurations of the imaging apparatus 10 shown in FIG. 5 are similar to those of the imaging apparatus 10 shown in FIG. 4 described above.

Also in the imaging apparatus 10 shown in FIG. 5, the light L incident on the peripheral region Rc is scattered by the recessed interface 29, and as a result, flare and the like can be reduced.

In particular, by forming the recessed interface 29 using the recess 11a of the first semiconductor substrate 11, the size (in particular, the depth) of the recessed interface 29 can be increased. Therefore, the degree of scattering of the light L incident on the recessed interface 29 is further increased, and flare and the like can be more effectively reduced.

Furthermore, a larger recessed region can be defined by the recessed interface 29 to enable capturing of a larger amount of the bonding material 19 in the recessed region. Therefore, the bonding material 19 can be more effectively prevented from being unintendedly adhered to the effective pixel region structure 21, and the distance between the protruding body 13 and the lens member 27 in the layer extending direction D2 can be further shortened.

Figure 6:
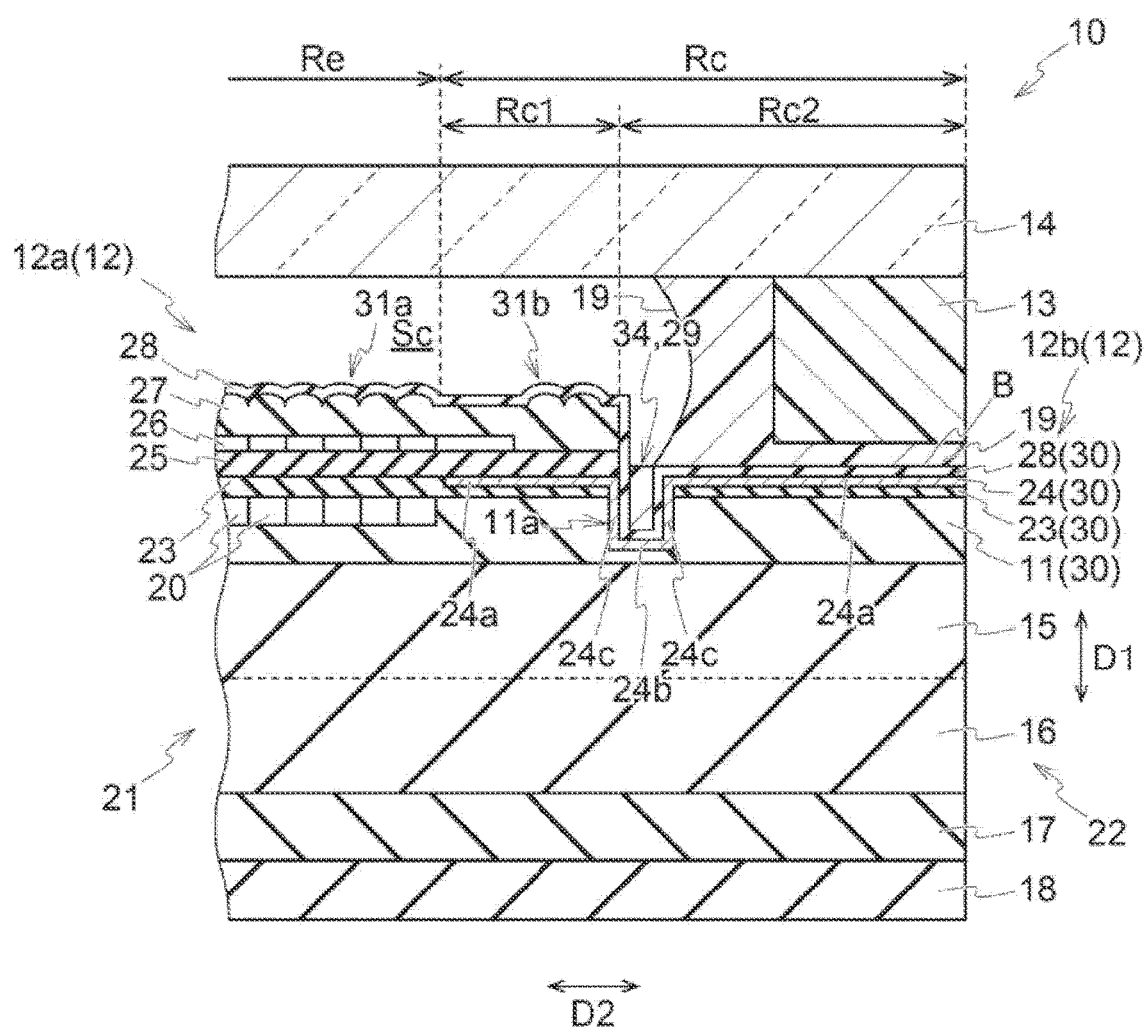
FIG. 6 is an enlarged cross-sectional view showing a third structure example of the imaging apparatus.

FIG. 6 is an enlarged cross-sectional view showing a third structure example of the imaging apparatus 10.

The recessed interface 29 may be provided at a position adjacent to the lens member 27 (optical element) regarding the relative position in the layer extending direction D2.

In the imaging apparatus 10 shown in FIG. 6, regarding the relative position in the layer extending direction D2, the contact groove 34 (that is, the through hole of the first light-entering side insulating layer 23 and the recess 11a of the first semiconductor substrate 11) is provided so as to be adjacent to the lens member 27 and the second light-entering side insulating layer 25.

In the example shown in FIG. 6, each of the lens member 27 and the second light-entering side insulating layer 25 forms an interface with the light shielding part 24 (particularly, the third light shielding part 24c), the interface being included in the same plane extending parallel to the laminating direction D1. A portion of the protective film 28 positioned on the interface extends parallel to the laminating direction D1 and forms the recessed interface 29 (particularly, the recessed interface 29 forming a side wall surface of the recessed region).

Other configurations of the imaging apparatus 10 shown in FIG. 6 are similar to those of the imaging apparatus 10 shown in FIG. 5 described above.

Also in the imaging apparatus 10 shown in FIG. 6, the light L incident on the peripheral region Rc can be scattered at the recessed interface 29 to reduce flare and the like, and the bonding material 19 can be captured in the recessed region defined by the recessed interface 29.

Even if the entire contact groove 34 is filled with the bonding material 19, the optical element (that is, the peripheral optical element portion 31b (in particular, the lens member 27 and the second light-entering side insulating layer 25)) positioned in the first peripheral region Rc1 prevents the bonding material 19 from flowing out to the effective pixel region Re side.

Figure 7:
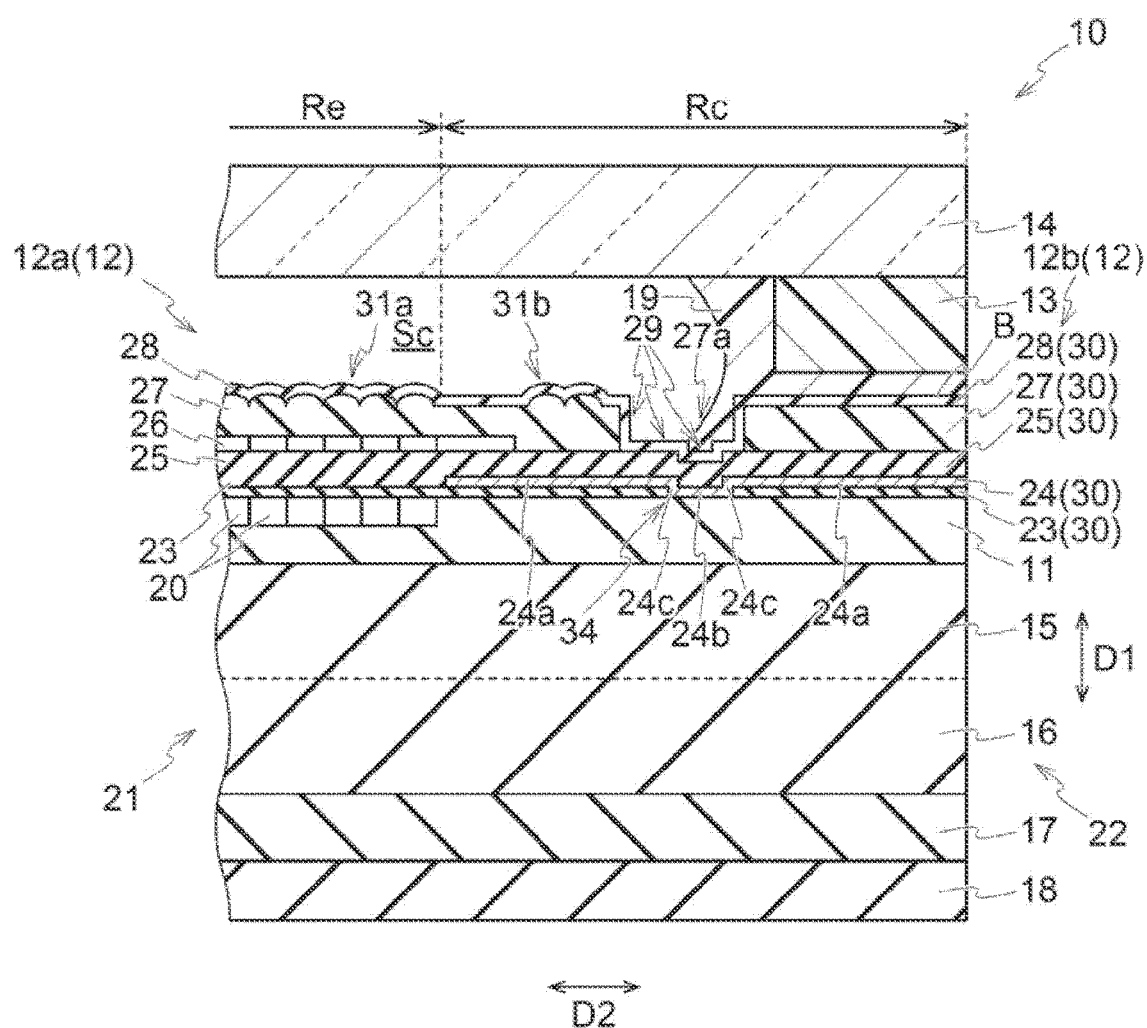
FIG. 7 is an enlarged cross-sectional view showing a fourth structure example of the imaging apparatus.

FIG. 7 is an enlarged cross-sectional view showing a fourth structure example of the imaging apparatus 10.

The recessed interface 29 may include a portion of the lens member 27 positioned in the peripheral region Rc (that is, the lens member 27 included in the peripheral optical element portion 31b).

In the imaging apparatus 10 shown in FIG. 7, the second light-entering side insulating layer 25 extends in the layer extending direction D2 so as to cover the entire light-entering side surface of the first semiconductor substrate 11, and is present not only in the effective pixel region Re but also in the peripheral region Rc.

In addition, the lens member 27 extends in the layer extending direction D2 so as to cover the entire light-entering side surface of the first semiconductor substrate 11. However, the lens member 27 has a through hole (that is, a "lens recess") 27a in the peripheral region Rc.

The lens recess 27a is provided at a position corresponding to the through hole (that is, the contact groove 34) of the first light-entering side insulating layer 23. That is, an imaginary line extending in parallel with the laminating direction D1 passes through both the lens recess 27a and the contact groove 34. As described above, the lens member 27 is provided so as to sandwich the lens recess 27a, and is also positioned between the protruding body 13 and the first semiconductor substrate 11 (particularly, between the protective film 28 and the second light-entering side insulating layer 25).

In a range where the lens recess 27a is not present among the peripheral region Rc, the first light-entering side insulating layer 23, the light shielding part 24, the second light-entering side insulating layer 25, the lens member 27, and the protective film 28 are sequentially laminated on the light-entering side surface of the first semiconductor substrate 11.

On the other hand, in a range where the lens recess 27a is present among the peripheral region Rc, the first light-entering side insulating layer 23, the light shielding part 24, the second light-entering side insulating layer 25, and the protective film 28 are sequentially laminated on the light-entering side surface of the first semiconductor substrate 11. In particular, in a range where both the lens recess 27a and the contact groove 34 are present, the light shielding part 24 (particularly, the second light shielding part 24b and the third light shielding part 24c), the second light-entering side insulating layer 25, and the protective film 28 are sequentially laminated on the light-entering side surface of the first semiconductor substrate 11.

Note that the color filter 26 is not provided between the protruding body 13 and the first semiconductor substrate 11 in the example shown in FIG. 7, but the color filter 26 may be provided between the protruding body 13 and the first semiconductor substrate 11.

Each of the first light-entering side insulating layer 23, the light shielding part 24, the second light-entering side insulating layer 25, and the protective film 28 has a substantially uniform thickness over the entire effective pixel region Re and the peripheral region Rc.

Therefore, in a range corresponding to the contact groove 34, each of the first light-entering side insulating layer 23, the light shielding part 24, the second light-entering side insulating layer 25, and the protective film 28 forms the recessed interface 29. In addition, in a range corresponding to the lens recess 27a, each of the protective film 28 and the lens member 27 forms the recessed interface 29. Note that, the recessed interface 29 formed by the first light-entering side insulating layer 23 hardly or not at all contributes to the reflection (scattering) of the light L because the recessed interface 29 is covered by the light shielding part 24.

In the example shown in FIG. 7, only a part of the recessed region defined by the recessed interface 29 (particularly, the protective film 28) is filled with the bonding material 19. The other portion of the recessed region is a space and constitutes a part of the cavity space Sc.

Other configurations of the imaging apparatus 10 shown in FIG. 7 are similar to those of the imaging apparatus 10 shown in FIG. 4 described above.

Also in the imaging apparatus 10 shown in FIG. 7, the light L incident on the peripheral region Rc can be scattered at the recessed interface 29 to reduce flare and the like, and the bonding material 19 can be captured in the recessed region defined by the recessed interface 29.

In particular, the lens member 27 itself can have a function of blocking the bonding material 19 from flowing out. In a case where the thickness of the lens member 27 is larger than the thickness of the first light-entering side insulating layer 23, the lens recess 27a of the lens member 27 can be provided larger than the through hole (that is, the contact groove 34) of the first light-entering side insulating layer 23. Therefore, in this case, a larger amount of the bonding material 19 can be stored in the lens recess 27a, and the flowing out of the bonding material 19 toward the effective pixel region Re side can be more effectively blocked.

Figure 8:
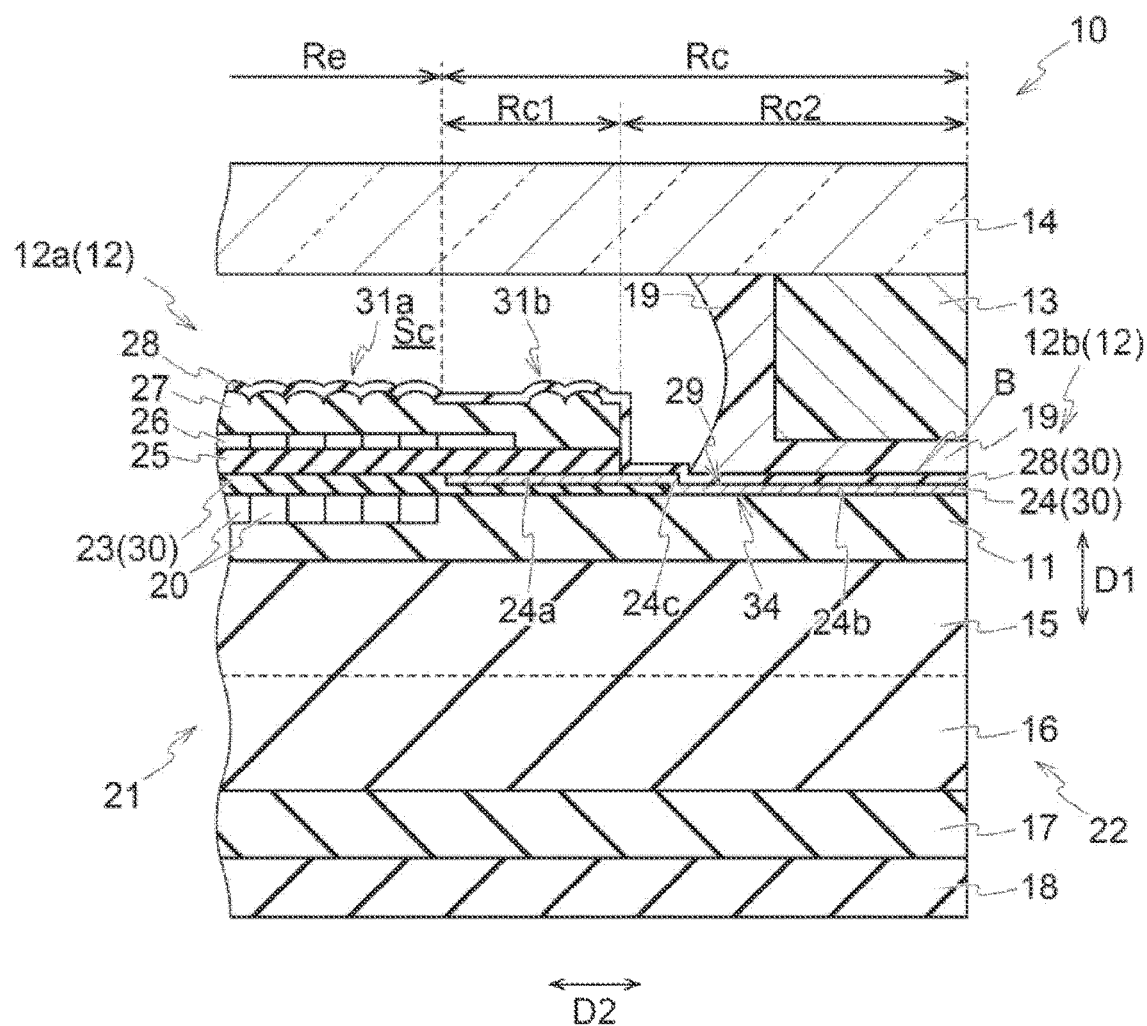
FIG. 8 is an enlarged cross-sectional view showing a fifth structure example of the imaging apparatus.

FIG. 8 is an enlarged cross-sectional view showing a fifth structure example of the imaging apparatus 10.

The recessed interface 29 may extend at least from a position between the lens member 27 (optical element) and the protruding body 13 to a position between the protruding body 13 and the first semiconductor substrate 11 in the layer extending direction D2.

In the imaging apparatus 10 shown in FIG. 8, the contact groove 34 extends from a position between the lens member 27 and the protruding body 13 to a position between the protruding body 13 and the first semiconductor substrate 11 (specifically, extends over a chip end surface (scribe line) of the imaging apparatus 10) in the layer extending direction D2.

The light shielding part 24, the protective film 28, and the bonding material 19 are provided in a laminated state between the protruding body 13 and the first semiconductor substrate 11, but the first light-entering side insulating layer 23 is not provided. Therefore, between the protruding body 13 and the first semiconductor substrate 11, the light shielding part 24 (particularly, the second light shielding part 24b) is in contact with the light-entering side surface of the first semiconductor substrate 11 over the entire region in the layer extending direction D2.

Other configurations of the imaging apparatus 10 shown in FIG. 8 are similar to those of the imaging apparatus 10 shown in FIG. 4 described above.

Also in the imaging apparatus 10 shown in FIG. 8, the light L incident on the peripheral region Rc can be scattered at the recessed interface 29 to reduce flare and the like, and the bonding material 19 can be captured in the recessed region defined by the recessed interface 29.

In particular, because the first light-entering side insulating layer 23 is not provided between the protruding body 13 and the first semiconductor substrate 11, the imaging apparatus of the present example is advantageous for downsizing the imaging apparatus 10 in the laminating direction D1.

Figure 9:
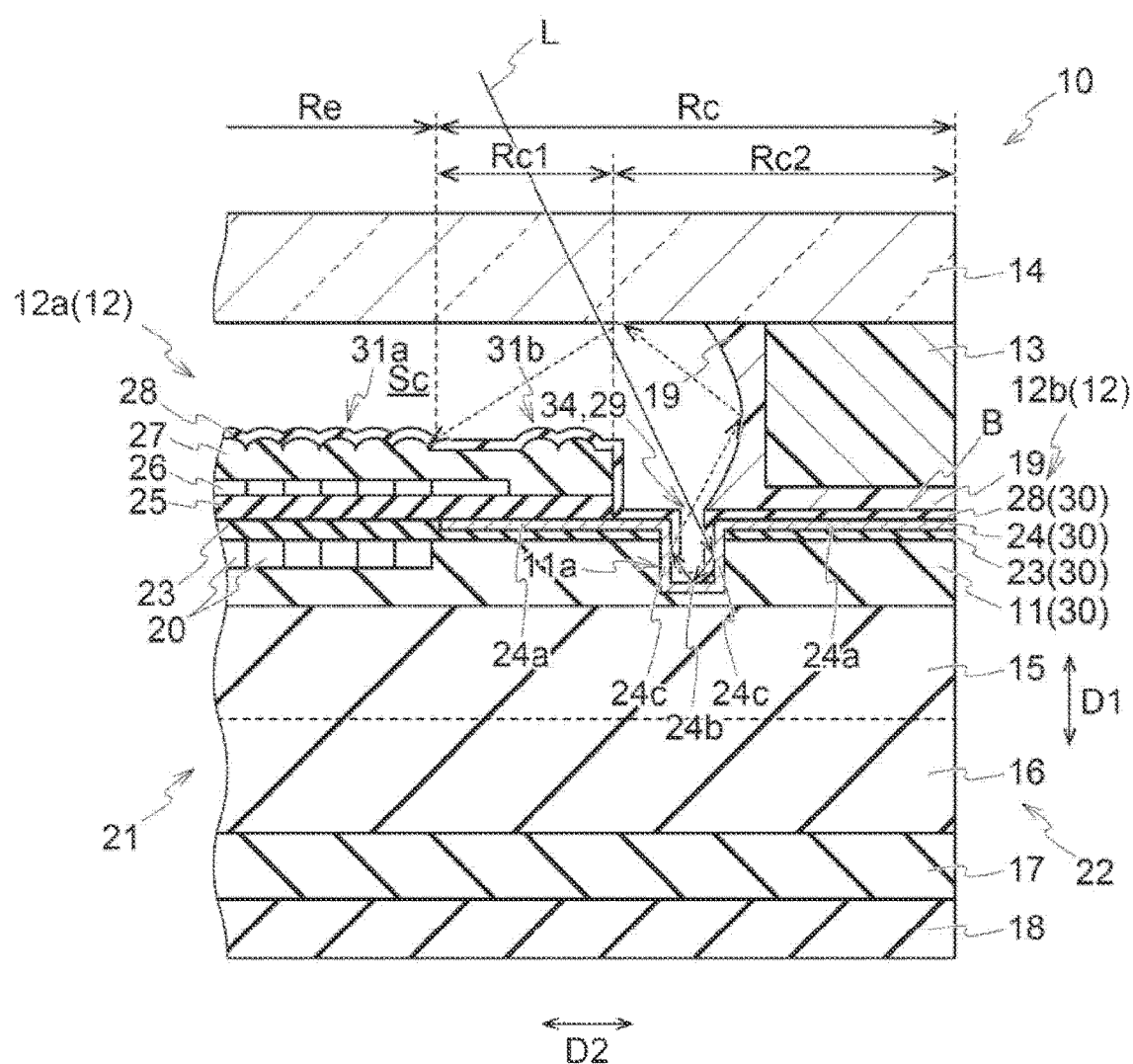
FIG. 9 is an enlarged cross-sectional view showing a sixth structure example of the imaging apparatus.

FIG. 9 is an enlarged cross-sectional view showing a sixth structure example of the imaging apparatus 10.

An entire or a part of the recessed region defined by the recessed interface 29 may be a space.

In the imaging apparatus 10 shown in FIG. 9, the entire recessed region defined by the recessed interface 29 (in this example, the recessed interface 29 formed by the protective film 28) is provided as a space, and constitutes a part of the cavity space Sc.

Other configurations of the imaging apparatus 10 shown in FIG. 9 are similar to those of the imaging apparatus 10 shown in FIG. 5 described above.

Also in the imaging apparatus 10 shown in FIG. 9, at least a part of the light L incident on the peripheral region Rc (specifically, the recessed interface 29) is scattered, and flare and the like are reduced.

In particular, by making at least a part of the recessed region defined by the recessed interface 29 a space, the degree of scattering of the light L in the recessed interface 29 can be increased, and further reduction of flare and the like can be expected.

Figure 10:
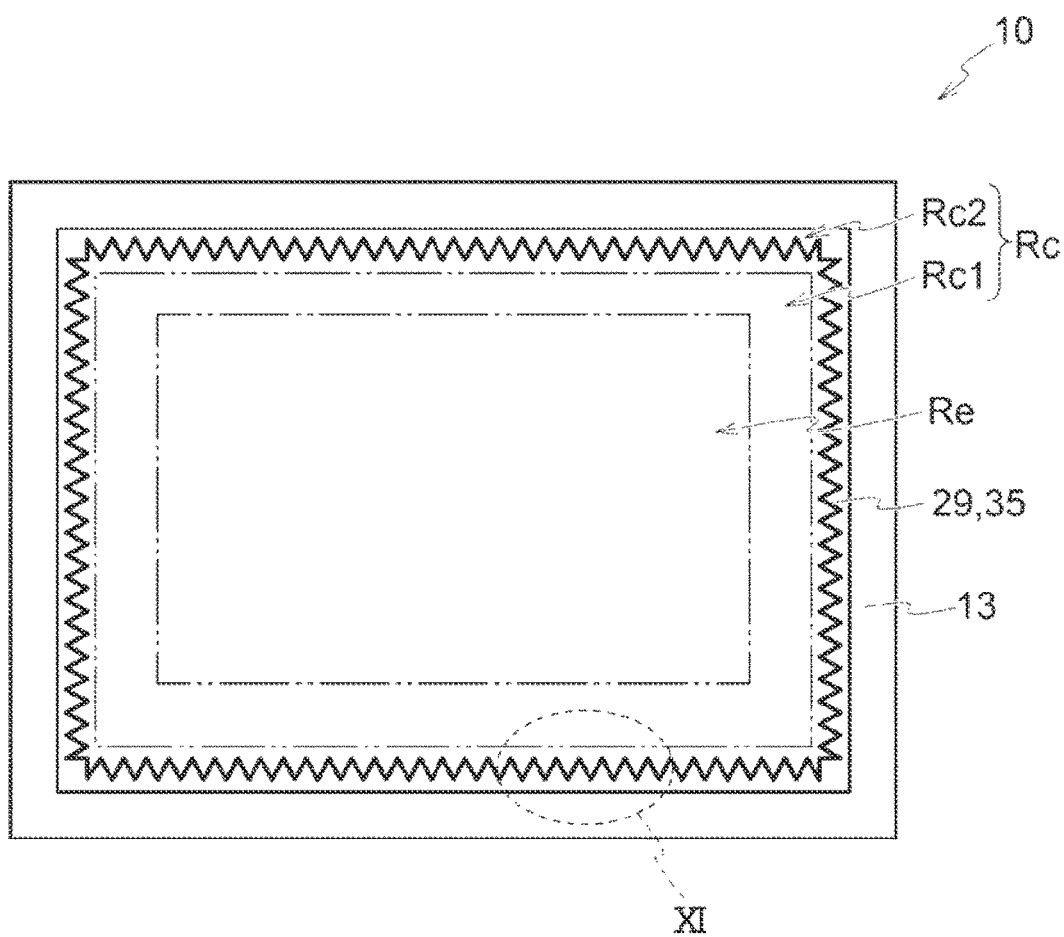
FIG. 10 is a schematic plan view of the imaging apparatus showing an arrangement example of an effective pixel region, a peripheral region, a recessed region defined by a recessed interface, and a protruding body.

FIG. 10 is a schematic plan view of the imaging apparatus 10 showing an arrangement example of the effective pixel region Re, the peripheral region Rc, the recessed region 35 defined by the recessed interface 29, and the protruding body 13. For easy understanding, in FIG. 10, illustration of elements other than the effective pixel region Re, the peripheral region Rc, the recessed interface 29, the recessed region 35, and the protruding body 13 is omitted.

The recessed interface 29 may at least partially have an uneven portion. In this case, the recessed interface 29 can irregularly reflect and scatter the light L, and can effectively reduce flare and the like.

The recessed interface 29 and the recessed region 35 shown in FIG. 10 have a zigzag planar shape as a whole, and the recessed portion and the protruding portion alternately and regularly appear along the extending direction. However, specific forms of the uneven portion and the recessed region 35 included in the recessed interface 29 are not limited.

Figure 11:
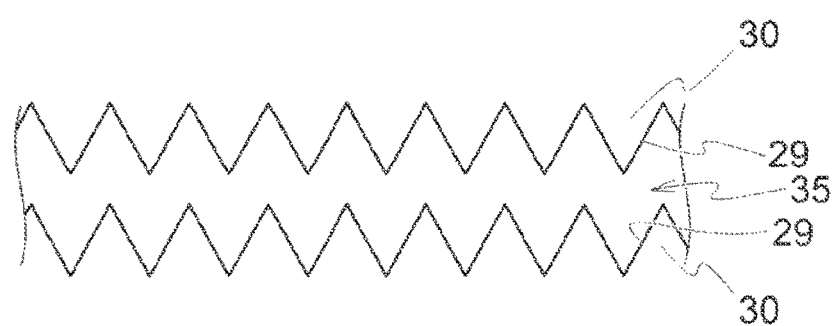
FIG. 11 is an enlarged plan view exemplifying a part (see a reference sign "XI" in FIG. 10) of the recessed region defined by the recessed interface.
Figure 12:
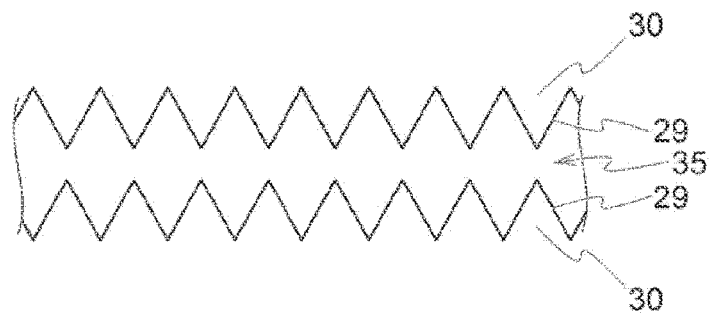
FIG. 12 is an enlarged plan view exemplifying a part (see a reference sign "XI" in FIG. 10) of the recessed region defined by the recessed interface.
Figure 13:
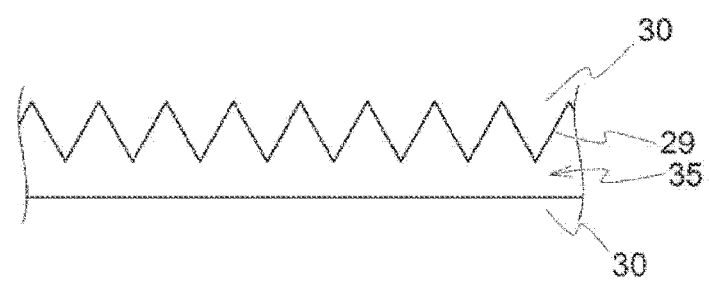
FIG. 13 is an enlarged plan view exemplifying a part (see a reference sign "XI" in FIG. 10) of the recessed region defined by the recessed interface.

FIGS. 11 to 13 are enlarged plan views each exemplifying a part (see a reference sign "XI" in FIG. 10) of the recessed region 35 defined by the recessed interface 29.

For example, as shown in FIGS. 11 and 12, each of the recessed interfaces 29 forming both side surfaces of the recessed region 35 (that is, the side surface on the effective pixel region Re side and the side surface on the protruding body 13 side) may have an uneven shape (for example, a zigzag shape).

In this case, the uneven shape of the recessed interface 29 forming one side surface of the recessed region 35 and the uneven shape of the recessed interface 29 forming the other side surface thereof may coincide with each other or may be different from each other.

The uneven portion of the recessed interface 29 forming one side surface of the recessed region 35 and the uneven portion of the recessed interface 29 forming the other side surface thereof may have at least one of the size and the pitch that is different from each other. For example, the width of the recessed portion of the recessed interface 29 forming one side surface of the recessed region 35 may be different from the width of the recessed portion of the recessed interface 29 forming the other side surface of the recessed region 35. Similarly, the width of the protruding portion of the recessed interface 29 forming one side surface of the recessed region 35 may be different from the width of the protruding portion of the recessed interface 29 forming the other side surface of the recessed region 35.

The recessed portion of the recessed interface 29 forming one side surface of the recessed region 35 may face the protruding portion (see FIG. 11) or the recessed portion (see FIG. 12) of the recessed interface 29 forming the other side surface thereof. Similarly, the protruding portion of the recessed interface 29 forming one side surface of the recessed region 35 may face the recessed portion (see FIG. 11) or the protruding portion (see FIG. 12) of the recessed interface 29 forming the other side surface thereof.

The uneven shape of the recessed interface 29 forming one side surface of the recessed region 35 and the uneven shape of the recessed interface 29 forming the other side surface thereof may be provided with the same recessed and protruding pitch or may be provided in different recessed and protruding pitches from each other.

As shown in FIG. 13, only one of the recessed interfaces 29 forming both side surfaces of the recessed region 35 may have an uneven shape (for example, a zigzag shape), and the other of the recessed interfaces 29 may have a planar shape. In this case, the recessed interface 29 forming the side surface closer to the effective pixel region Re among the both side surfaces of the recessed region 35 may have the uneven portion, or the recessed interface 29 forming the side surface farther from the effective pixel region Re may have the uneven portion.

Figure 14:
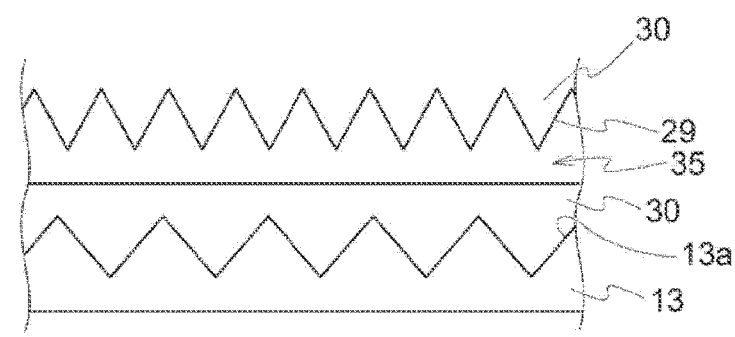
FIG. 14 is an enlarged plan view exemplifying the recessed region defined by the recessed interface and the protruding body.

FIG. 14 is an enlarged plan view exemplifying the recessed region 35 defined by the recessed interface 29 and the protruding body 13. For easy understanding, only the recessed interface forming body 30, the recessed interface 29, the recessed region 35, and the protruding body 13 (including a protruding uneven surface 13*a*) are illustrated in FIG. 14.

The surface of the protruding body 13 on the optical element side (that is, the recessed interface 29 side) may at least partially have an uneven portion (for example, a zigzag shape). In this case, because the protruding body 13 irregularly reflects (scatters) the light L, flare and the like can be effectively reduced.

In a case where the protruding body 13 has an uneven portion, the recessed interface 29 may also have an uneven portion (see FIG. 14). In this case, flare and the like can be more effectively reduced.

The uneven portion of the recessed interface 29 and the uneven portion of the protruding uneven surface 13*a* of the protruding body 13 may have at least one of the size and the pitch that is different from each other. For example, the width of the recessed portion of the recessed interface 29 may be different from the width of the recessed portion of the protruding body 13. Similarly, the width of the protruding portion of the recessed interface 29 may be different from the width of the protruding portion of the protruding body 13. Furthermore, the uneven portion of the recessed interface 29 and the uneven portion of the protruding body 13 may be provided with the same recessed and protruding pitch or may be provided in different recessed and protruding pitches from each other.

Figure 15:
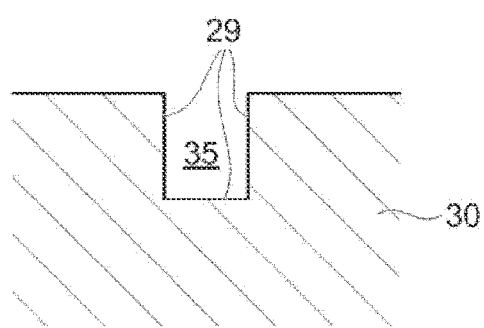
FIG. 15 is a cross-sectional view of a recessed interface forming body showing an example of a shape of the recessed interface.
Figure 16:
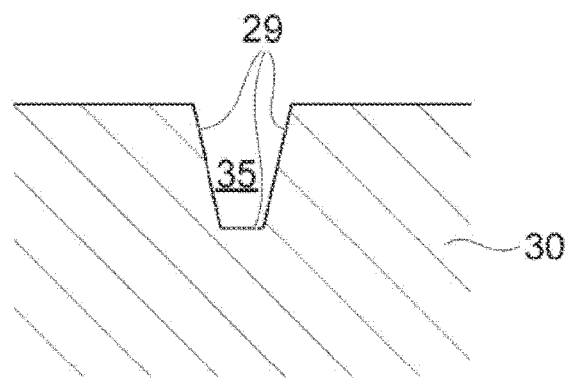
FIG. 16 is a cross-sectional view of a recessed interface forming body showing an example of a shape of the recessed interface.
Figure 17:
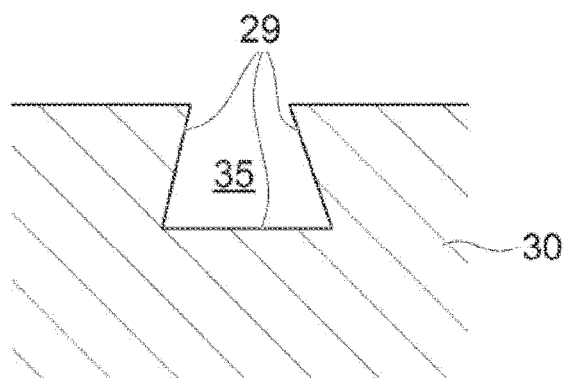
FIG. 17 is a cross-sectional view of a recessed interface forming body showing an example of a shape of the recessed interface.

FIGS. 15 to 17 are cross-sectional views of the recessed interface forming body 30 showing an example of a shape of the recessed interface 29. In FIGS. 15 to 17, the recessed region 35 defined by the recessed interface 29 is shown as a space, but other members may be present entirely or partially in the recessed region 35.

The shape of the recessed interface 29 is not limited. For example, the recessed interface 29 defining the recessed region 35 may have a rectangular cross-sectional shape (see FIG. 15). In addition, the recessed interface 29 (particularly, the recessed interface 29 forming the side surface of the recessed region 35) may be provided in a forward tapered shape (see FIG. 16) or in a reverse tapered shape (see FIG. 17).

In a case where the recessed interface 29 is provided in a forward tapered shape, the bonding material 19 easily flows into the recessed region 35. On the other hand, in a case where the recessed interface 29 is provided in a reverse tapered shape, the bonding material 19 is less likely to flow out from the recessed region 35, and the light L incident on the recessed region 35 is less likely to exit from the recessed region 35, which can effectively reduce flare and the like.

First Modified Example

The cavity space Sc between the covering part 12 and the cover body 14 may be filled with a light-transmissive member (that is, a filler) such as resin.

Figure 18:
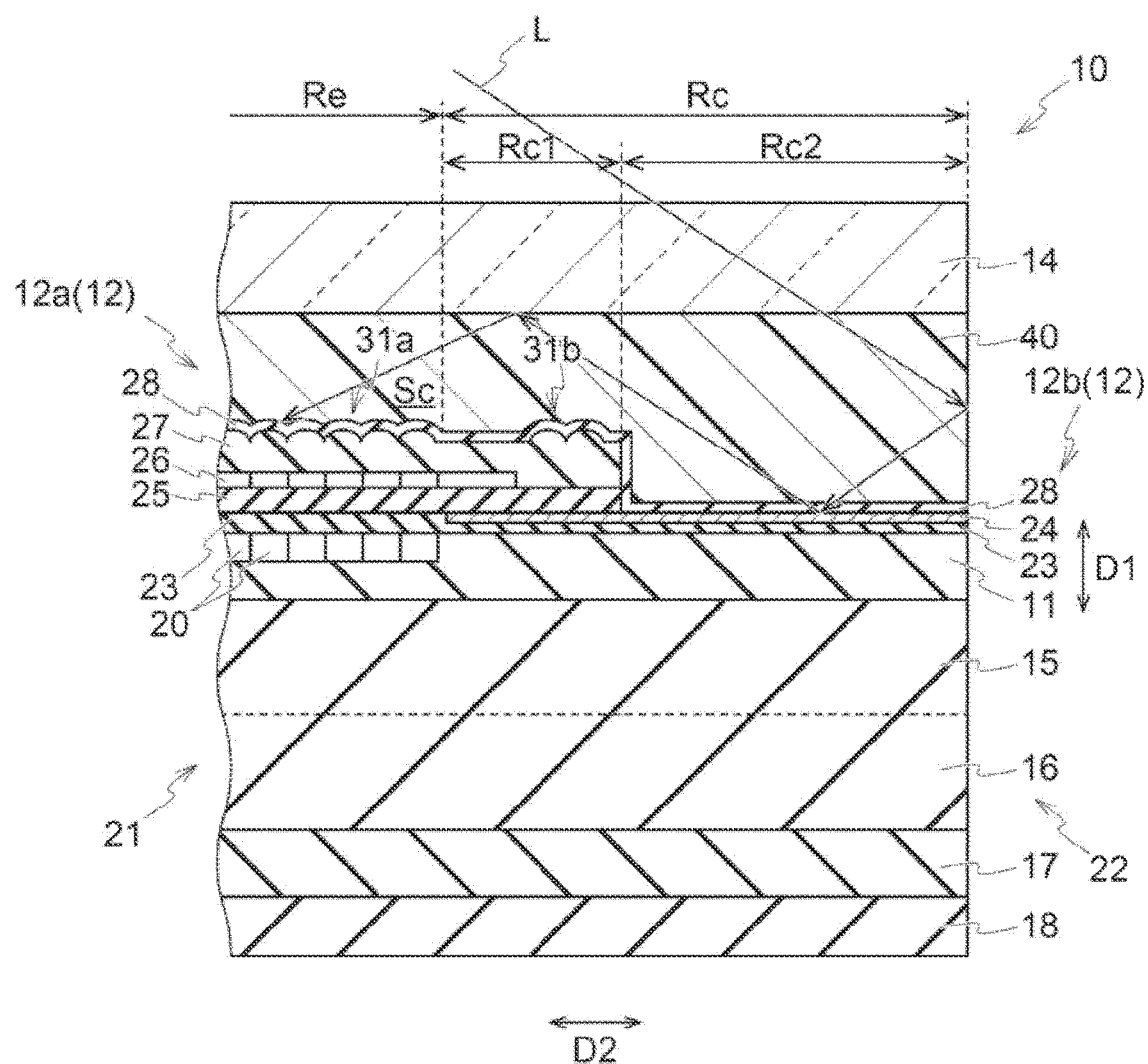
FIG. 18 is an enlarged cross-sectional view showing a schematic configuration example of the imaging apparatus.

FIG. 18 is an enlarged cross-sectional view showing a schematic configuration example of the imaging apparatus 10.

In the imaging apparatus 10 shown in FIG. 18, a region (that is, the cavity space Sc) between the covering part 12 (that is, the effective covering part 12*a* and the peripheral covering part 12*b*) and the cover body 14 are filled with a translucent filler 40. The filler 40 is provided so as to be in contact with and bonded to the protective film 28 and the cover body 14, and supports the cover body 14. Therefore, in the imaging apparatus 10 shown in FIG. 18, the protruding body 13 and the bonding material 19 described above are not provided.

Other configurations of the imaging apparatus 10 shown in FIG. 18 are similar to those of the imaging apparatus 10 shown in FIG. 3 described above.

Even in a case where the cavity space Sc is filled with the filler 40 and the protruding body 13 is not provided, as shown in FIG. 18, the light L may be reflected at the end part (that is, the interface) of the filler 40 to become stray light, which possibly causes flare or the like in the captured image.

Figure 19:
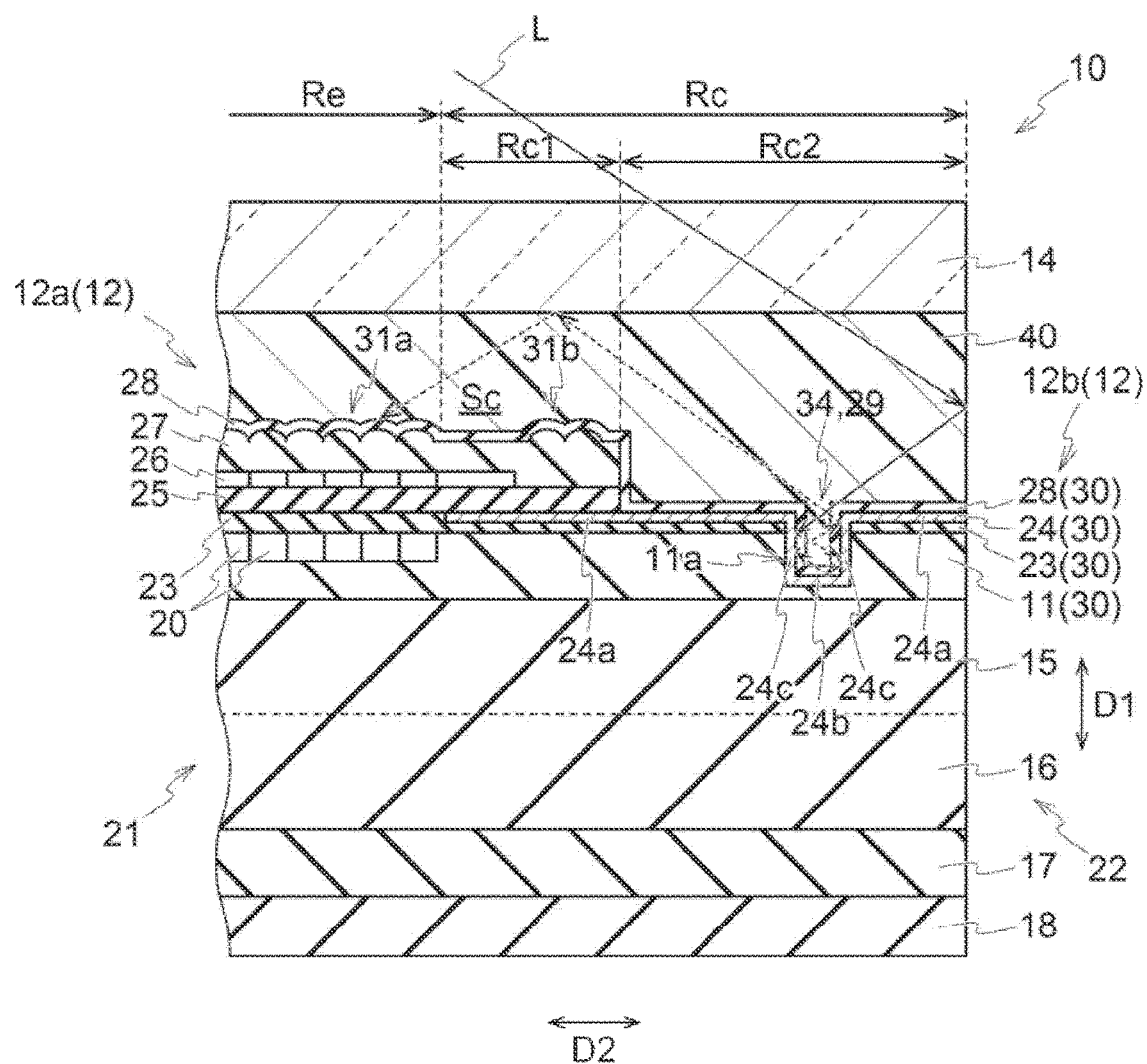
FIG. 19 is an enlarged cross-sectional view showing a seventh structure example of the imaging apparatus.

FIG. 19 is an enlarged cross-sectional view showing a seventh structure example of the imaging apparatus 10. The imaging apparatus 10 shown in FIG. 19 has the recessed interface 29 in the peripheral region Rc (particularly, the second peripheral region Rc2). The recessed interface 29 shown in FIG. 19 has a similar configuration as the recessed interface 29 shown in FIG. 5 described above, and is formed at a position corresponding to the contact groove 34 (that is, the through hole of the first light-entering side insulating layer 23 and the recess 11*a* of the first semiconductor substrate 11).

Other configurations of the imaging apparatus 10 shown in FIG. 19 are similar to those of the imaging apparatus 10 shown in FIG. 18 described above.

Even in a case where the cavity space Sc is filled with the filler 40 and is not a space, the influence of stray light can be suppressed and flare and the like can be reduced by providing the recessed interface 29.

Other Modified Examples

The recessed interface 29 may include a surface that defines a recess other than the contact groove 34. In this case, the recess constituting the recessed interface 29 may be a hole penetrating a member serving as the recessed interface forming body 30, or may be a hole having a bottom and not penetrating the member.

In the imaging apparatus 10 in FIG. 7, the lens recess 27*a* is provided at a position corresponding to the through hole (that is, the contact groove 34) of the first light-entering side insulating layer 23, but the lens recess 27*a* may be provided at a position not corresponding to the contact groove 34.

The imaging apparatuses 10 shown in the respective drawings may be combined as appropriate. For example, the imaging apparatus 10 shown in each of FIGS. 4 to 9 and 19 may appropriately have the structure shown in FIGS. 10 to 17. Furthermore, the configurations of the imaging apparatuses 10 respectively shown in FIGS. 4 to 9 and 19 may be appropriately combined.

It should be noted that the embodiment and modified examples disclosed herein are merely exemplification in all respects and are not to be construed as limiting. The above-described embodiment and modified examples can be omitted, replaced, and changed in various forms without departing from the scope and spirit of the appended claims. For example, the above-described embodiment and modified examples may be combined in whole or in part, and embodiments other than the above-described embodiment and modified examples may be combined with the above-described embodiment or modified examples. Furthermore, the effects of the present disclosure described in the present description are merely exemplification, and other effects may be provided.

In addition, the technical category embodying the above-described technical idea is not limited. For example, the above-described technical idea may be embodied by a computer program for causing a computer to execute one or a plurality of procedures (steps) included in a method of manufacturing or using the above-described apparatus. In addition, the above-described technical idea may be embodied by a computer-readable non-transitory recording medium in which such a computer program is recorded.

Note that the present disclosure can have the following configurations.

[Item 1]

An imaging apparatus including:
a semiconductor substrate including a plurality of effective pixels that performs photoelectric conversion;
an effective covering part including an optical element and covering the plurality of effective pixels in the semiconductor substrate; and
a peripheral covering part covering a portion positioned outside the plurality of effective pixels in the semiconductor substrate,
in which the plurality of effective pixels and the effective covering part are included in an effective pixel region structure,
the portion positioned outside the plurality of effective pixels in the semiconductor substrate and the peripheral covering part are included in a peripheral region structure, and
the peripheral region structure includes a recessed interface including a member different from the optical element.

[Item 2]

An imaging apparatus including:
a semiconductor substrate including a plurality of effective pixels that performs photoelectric conversion;
an effective covering part including an optical element provided with a lens member and covering the plurality of effective pixels in the semiconductor substrate; and
a peripheral covering part covering a portion positioned outside the plurality of effective pixels in the semiconductor substrate,
in which the optical element is divided into an effective optical element portion included in the effective covering part and a peripheral optical element portion included in the peripheral covering part, and
the lens member included in the peripheral optical element portion has a recessed interface.

[Item 3]

The imaging apparatus according to Item 1, in which the recessed interface is provided at a position away from the optical element in a layer extending direction perpendicular to a direction in which the semiconductor substrate and the optical element are laminated.

[Item 4]

The imaging apparatus according to Item 1, in which the recessed interface is provided adjacent to the optical element in a layer extending direction perpendicular to a direction in which the semiconductor substrate and the optical element are laminated.

[Item 5]

The imaging apparatus according to any one of Items 1, 3, and 4, in which an entire part of the recessed interface is formed by a recess provided in the peripheral covering part.

[Item 6]

The imaging apparatus according to any one of Items 1 and 3 to 5,
in which the peripheral covering part includes:
an insulating layer positioned on the semiconductor substrate; and
a light shielding part including a first light shielding part positioned on the semiconductor substrate with the insulating layer interposed between the first light shielding part and the semiconductor substrate, and a second light shielding part positioned on the semiconductor substrate, and
the peripheral region structure includes a portion forming the recessed interface, the portion including the second light shielding part.

[Item 7]

The imaging apparatus according to any one of Items 1, 3 to 6, in which at least a part of the recessed interface is formed by a recess provided in the semiconductor substrate.

[Item 8]

The imaging apparatus according to any one of Items 1 and 3 to 7 further including:
a protruding body positioned outside the plurality of effective pixels and protruding more than the optical element; and
a bonding material that bonds the protruding body to the semiconductor substrate,
in which the recessed interface is positioned at least between the optical element and the protruding body with respect to the layer extending direction perpendicular to the direction in which the semiconductor substrate and the optical element are laminated.

[Item 9]

The imaging apparatus according to Item 8, in which the recessed interface extends at least from a position between the optical element and the protruding body to a position between the protruding body and the semiconductor substrate in the layer extending direction.

[Item 10]

The imaging apparatus according to Item 8 or 9, in which the recessed interface is connected to a bonding surface including a surface of a member included in the peripheral region structure, the bonding surface being in contact with the bonding material.

[Item 11]

The imaging apparatus according to any one of Items 1 to 10, in which an entire or a part of a recessed region defined by the recessed interface is a space.

[Item 12]

The imaging apparatus according to any one of Items 1 to 11, in which the recessed interface at least partially has an uneven portion.

[Item 13]

The imaging apparatus according to any one of Items 1 to 12, further including
a protruding body positioned outside the plurality of effective pixels and protruding more than the optical element,
in which the protruding body has a surface that at least partially has an uneven portion on a side of the optical element.

[Item 14]

The imaging apparatus according to Item 12, further including
a protruding body positioned outside the plurality of effective pixels and protruding more than the optical element,
in which the protruding body has a surface that at least partially has an uneven portion on the side of the optical element, and the uneven portion included in the recessed interface and the uneven portion included in the protruding body are different from each other in at least one of a size and a pitch.

[Item 15]
The imaging apparatus according to any one of Items 1 to 14, in which the recessed interface is provided in a forward tapered shape.

[Item 16]
The imaging apparatus according to any one of Items 1 to 14, in which the recessed interface is provided in a reverse tapered shape.

[Item 17]
The imaging apparatus according to any one of Items 1 to 16, further including
a cover body positioned on a side of the optical element opposite to the semiconductor substrate, the cover body covering at least the plurality of effective pixels,
in which the optical element and the cover body have a space formed between the optical element and the cover body.

[Item 18]
The imaging apparatus according to any one of Items 1 to 16, further including:
a cover body positioned on a side of the optical element opposite to the semiconductor substrate, the cover body covering at least the plurality of effective pixels; and
a filler that fills a region between each of the effective covering part and the peripheral covering part and the cover body.

REFERENCE SIGNS LIST

10 Imaging apparatus
11 First semiconductor substrate
11a Recess
12 Covering part
12a Effective covering part
12b Peripheral covering part
13 Protruding body
13a Protruding uneven surface
14 Cover body
15 First wiring layer
16 Second wiring layer
17 Second semiconductor substrate
18 Covering insulating layer
19 Bonding material
20 Effective pixel
21 Effective pixel region structure
22 Peripheral region structure
23 First light-entering side insulating layer
24 Light shielding part
24a First light shielding part
24b Second light shielding part
24c Third light shielding part
25 Second light-entering side insulating layer
26 Color filter
27 Lens member
27a Lens recess
28 Protective film
29 Recessed interface
30 Recessed interface forming body
31a Effective optical element portion
31b Peripheral optical element portion
34 Contact groove
35 Recessed region
40 Filler B Bonding surface B
D1 Laminating direction
D2 Layer extending direction
L Light
Rc Peripheral region
Rc1 First peripheral region
Rc2 Second peripheral region
Re Effective pixel region
Sc Cavity space

What is claimed is:
1. An imaging apparatus comprising:
a semiconductor substrate including a plurality of effective pixels that performs photoelectric conversion;
an effective covering part covering the plurality of effective pixels and including a lens member; and
a peripheral covering part covering a portion of the semiconductor substrate positioned outside the plurality of effective pixels and including an insulating layer, a light shielding part covering the insulating layer and a protective film covering the light shielding part;
an effective pixel region structure comprising the plurality of effective pixels and the effective covering part; and
a peripheral region structure comprising a portion of the semiconductor substrate positioned outside the plurality of effective pixels and the peripheral covering part,
wherein, in the peripheral region structure,
the light shielding part at least partially fills a contact groove in the insulating layer such that the light shielding part includes a recessed region, and
the protective film at least partially fills the recessed region in the light shielding part such that the protective film includes a recessed region.

2. The imaging apparatus according to claim 1, wherein the contact groove, the recessed region in the light shielding part, and the recessed region in the protective film are provided at a position away from the lens member in a layer extending direction perpendicular to a direction in which the semiconductor substrate and the lens member are laminated.

3. The imaging apparatus according to claim 1, wherein the contact groove, the recessed region in the light shielding part, and the recessed region in the protective film are provided adjacent to the lens member in a layer extending direction perpendicular to a direction in which the semiconductor substrate and the lens member are laminated.

4. The imaging apparatus according to claim 1, wherein an entire part of each of the contact groove, the recessed region in the light shielding part, and the recessed region in the protective film are formed in the peripheral covering part.

5. The imaging apparatus according to claim 1, further comprising a recessed region provided in the semiconductor substrate at least partially filled by the protective film and the light shielding part.

6. The imaging apparatus according to claim 1, further comprising:
a protruding body positioned outside the plurality of effective pixels and protruding more than the lens member a direction in which the semiconductor substrate and the lens member are laminated; and
a bonding material that bonds the protruding body to the semiconductor substrate,
wherein the recessed each of the contact groove, the recessed region in the light shielding part, and the recessed region in the protective film are positioned between the lens member and the protruding body with respect to a layer extending direction perpendicular to a direction in which the semiconductor substrate and the lens member are laminated.

7. The imaging apparatus according to claim 6, wherein at least one of the contact groove, the recessed region in the light shielding part, and the recessed region in the protective film extend to a position between the protruding body and the semiconductor substrate in the layer extending direction.

8. The imaging apparatus according to claim 6, wherein the recessed region in the protective film includes a bonding surface, the bonding surface being in contact with the bonding material.

9. The imaging apparatus according to claim 1, wherein at least a part of the recessed region in the protective film is a space.

10. The imaging apparatus according to claim 1, wherein at least one of the contact groove, the recessed region in the light shielding part, and the recessed region in the protective film has a surface that at least partially has an uneven portion.

11. The imaging apparatus according to claim 1, further comprising a protruding body positioned outside the plurality of effective pixels and protruding more than the lens member a direction in which the semiconductor substrate and the lens member are laminated, wherein the protruding body has a surface that at least partially has an uneven portion on a side of the lens member.

12. The imaging apparatus according to claim 10, further comprising a protruding body positioned outside the plurality of effective pixels and protruding more than the lens member a direction in which the semiconductor substrate and the lens member are laminated, wherein the protruding body has a surface that at least partially has an uneven portion on a side of the lens member, and the uneven portion included in the surface of the at least one of the contact groove, the recessed region in the light shielding part, and the recessed region in the protective film and the uneven portion included in the surface of the protruding body are different from each other in at least one of a size and a pitch.

13. The imaging apparatus according to claim 1, wherein at least one of the contact groove, the recessed region in the light shielding part, and the recessed region in the protective film is provided in a forward tapered shape.

14. The imaging apparatus according to claim 1, wherein at least one of the contact groove, the recessed region in the light shielding part, and the recessed region in the protective film is provided in a reverse tapered shape.

15. The imaging apparatus according to claim 1, further comprising a cover body positioned on a side of the lens member opposite to the semiconductor substrate, the cover body covering at least the plurality of effective pixels, wherein the lens member and the cover body have a space formed between the lens member and the cover body.

16. The imaging apparatus according to claim 1, further comprising: a cover body positioned on a side of the lens member opposite to the semiconductor substrate, the cover body covering at least the plurality of effective pixels; and a filler that fills a region between each of the effective covering part and the peripheral covering part and the cover body.

17. An imaging apparatus comprising:
a semiconductor substrate including a plurality of effective pixels that performs photoelectric conversion;
an effective covering part covering the plurality of effective pixels and including a first portion of a lens member; and
a peripheral covering part covering a portion of the semiconductor substrate positioned outside the plurality of effective pixels and including a light shielding part, a second portion of the lens member covering the light shielding part, and a protective film covering the second portion of the lens member,
the second portion of the lens member includes a lens recess,
the protective film partially fills the lens recess such that the protective film includes a recessed region,
the light shielding part includes a recessed region, and
the lens recess overlaps the recessed region of the light shielding part in a direction in which the semiconductor substrate and the lens member are laminated.

\* \* \* \* \*